US012787874B2

(12) United States Patent
Jang et al.

(10) Patent No.: US 12,787,874 B2
(45) Date of Patent: Nov. 3, 2026

(54) SEMICONDUCTOR PACKAGE

(71) Applicant: Samsung Electronics Co., Ltd., Suwon-si (KR)

(72) Inventors: Wonjung Jang, Suwon-si (KR); Jungseok Ahn, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 448 days.

(21) Appl. No.: 18/311,289

(22) Filed: May 3, 2023

(65) Prior Publication Data

US 2024/0006382 A1 Jan. 4, 2024

(30) Foreign Application Priority Data

Jul. 4, 2022 (KR) ........................ 10-2022-0082133

(51) Int. Cl.

*H10W 90/00* (2026.01)
*H10W 20/20* (2026.01)
*H10W 74/10* (2026.01)
*H10W 74/47* (2026.01)
*H10W 72/00* (2026.01)
*H10W 74/15* (2026.01)

(52) U.S. Cl.

CPC ........... *H10W 90/00* (2026.01); *H10W 20/20* (2026.01); *H10W 74/111* (2026.01); *H10W 74/47* (2026.01); *H10W 72/07232* (2026.01); *H10W 74/15* (2026.01); *H10W 90/722* (2026.01); *H10W 90/732* (2026.01)

(58) Field of Classification Search

CPC ... H10W 90/00; H10W 20/20; H10W 74/111; H01L 23/481; H01L 25/18

See application file for complete search history.

(56) References Cited

U.S. PATENT DOCUMENTS 7,151,009 B2 * 12/2006 Kim ...................... H10W 20/20 257/E21.705
7,667,333 B2 * 2/2010 Singleton .............. H10W 72/90 257/E23.116

(Continued)

FOREIGN PATENT DOCUMENTS

CN 110943061 A * 3/2020 ............ H10W 90/00
CN 110943061 B * 12/2024 ............ H10W 90/00

(Continued)

*Primary Examiner* — Laura M Menz

(74) *Attorney, Agent, or Firm* — Wolf, Greenfield & Sacks, P.C.

(57) ABSTRACT

The reliability of stacked semiconductor packages may be improved via a semiconductor package including a first semiconductor chip including through silicon vias (TSVs) with respective upper conductive pads electrically connected to the TSVs, a second semiconductor chip on the first semiconductor chip with lower conductive pads on a lower surface of the second semiconductor chip, conductive bumps between the upper conductive pads and the lower conductive pads, and an interlayer adhesive layer between the first semiconductor chip and the second semiconductor chip. An interlayer space is between the first semiconductor chip and the second semiconductor chip and overlaps the first semiconductor chip and the second semiconductor chip in a vertical direction. The encapsulant extends into the interlayer space.

19 Claims, 11 Drawing Sheets

(56) References Cited

U.S. PATENT DOCUMENTS

| | | | | |
|---|---|---|---|---|
| 7,973,310 | B2 * | 7/2011 | Wang | H10W 20/20<br>257/E21.597 |
| 8,154,135 | B2 * | 4/2012 | Kim | H10D 62/117<br>257/692 |
| 8,513,802 | B2 * | 8/2013 | Ma | H10W 74/012<br>257/734 |
| 8,803,325 | B2 * | 8/2014 | Kim | H10W 20/49<br>257/774 |
| 9,184,153 | B2 * | 11/2015 | Lu | H10W 72/0198 |
| 9,812,425 | B2 * | 11/2017 | Cheah | H10W 20/20 |
| 10,023,775 | B2 * | 7/2018 | Kawamoto | C08G 59/508 |
| 10,403,603 | B2 * | 9/2019 | Park | H10D 62/10 |
| 10,658,300 | B2 * | 5/2020 | Kim | H05K 1/111 |
| 10,930,613 | B2 * | 2/2021 | Park | H10W 72/073 |
| 11,056,432 | B2 * | 7/2021 | Lee | H10P 54/00 |
| 11,164,805 | B2 * | 11/2021 | Kim | H10W 40/22 |
| 11,923,286 | B2 * | 3/2024 | Jang | H10W 70/65 |
| 12,406,895 | B2 * | 9/2025 | Jang | H10W 20/023 |
| 2005/0263869 | A1 * | 12/2005 | Tanaka | H10W 20/0234<br>257/E23.021 |
| 2007/0176275 | A1 * | 8/2007 | Singleton | H10W 72/90<br>257/E23.085 |
| 2009/0001602 | A1 * | 1/2009 | Chung | H10W 20/023<br>438/109 |
| 2009/0072375 | A1 * | 3/2009 | Song | H10W 74/012<br>257/686 |
| 2010/0007001 | A1 * | 1/2010 | Wang | H10W 20/20<br>257/E21.705 |
| 2011/0193229 | A1 * | 8/2011 | Ma | H10W 74/012<br>257/738 |
| 2013/0234320 | A1 * | 9/2013 | Lu | H10W 72/0198<br>257/737 |
| 2013/0292842 | A1 * | 11/2013 | Kim | H10W 20/49<br>257/774 |
| 2016/0056101 | A1 * | 2/2016 | Jee | H10P 72/74<br>257/737 |
| 2018/0040586 | A1 * | 2/2018 | Wei | H10W 70/611 |
| 2019/0221520 | A1 * | 7/2019 | Kim | H05K 1/111 |
| 2020/0098719 | A1 * | 3/2020 | Park | H10W 72/073 |
| 2021/0159213 | A1 * | 5/2021 | Kim | H10W 90/00 |
| 2022/0199511 | A1 * | 6/2022 | Jang | H10W 70/65 |
| 2022/0415741 | A1 * | 12/2022 | Jang | H10W 20/023 |
| 2023/0029098 | A1 * | 1/2023 | Kim | H10W 74/012 |
| 2023/0075665 | A1 * | 3/2023 | Kwon | H10D 62/117 |
| 2023/0092410 | A1 * | 3/2023 | Kim | H10P 72/74<br>257/668 |
| 2023/0130983 | A1 * | 4/2023 | Lee | H10W 40/22<br>257/787 |
| 2023/0326893 | A1 * | 10/2023 | Cha | H10W 20/20 |
| 2024/0006382 | A1 * | 1/2024 | Jang | H10W 20/20 |
| 2024/0063186 | A1 * | 2/2024 | Lee | H10P 72/74 |
| 2024/0113077 | A1 * | 4/2024 | Lee | H10W 20/0245 |
| 2024/0162184 | A1 * | 5/2024 | Park | H10B 80/00 |
| 2024/0297150 | A1 * | 9/2024 | Hong | H10P 72/74 |
| 2025/0118714 | A1 * | 4/2025 | Ma | H10W 74/121 |
| 2025/0149526 | A1 * | 5/2025 | Jang | H10B 80/00 |
| 2025/0329674 | A1 * | 10/2025 | Ko | H10W 72/90 |
| 2025/0364347 | A1 * | 11/2025 | Jang | H10W 20/023 |

FOREIGN PATENT DOCUMENTS

| | | | | | |
|---|---|---|---|---|---|
| EP | 4632813 | A2 | * | 10/2025 | H10W 90/00 |
| KR | 100914977 | B1 | * | 9/2009 | H01L 25/105 |
| KR | 101229649 | B1 | * | 2/2013 | H10W 70/60 |
| KR | 10-2020-0034895 | A | | 4/2020 | |
| KR | 102171286 | B1 | * | 10/2020 | H10D 62/117 |
| KR | 10-2021-0088305 | A | | 7/2021 | |
| KR | 10-2021-0148743 | A | | 12/2021 | |
| KR | 102521881 | B1 | * | 4/2023 | H10W 72/0198 |
| KR | 102530763 | B1 | * | 5/2023 | H10W 90/00 |
| KR | 102647175 | B1 | * | 3/2024 | H10W 74/131 |

* cited by examiner

SEMICONDUCTOR PACKAGE

CROSS-REFERENCE TO RELATED APPLICATION

This application is based on and claims priority under 35 U.S.C. § 119 to Korean Patent Application No. 10-2022-0082133, filed on Jul. 4, 2022, in the Korean Intellectual Property Office, the disclosure of which is incorporated by reference herein in its entirety.

BACKGROUND

The inventive concept relates to a semiconductor package.

With the development of the electronics industry and increasing user demand, electronic devices are more compact and lighter, and semiconductor packages used in the electronic devices are required to be compact and light or less weight and have high performance and large capacity. To realize a smaller size, less weight, high performance, and large capacity, semiconductor chips including through silicon vias (TSVs) and a semiconductor package in which the semiconductor chips are stacked are being continuously researched and developed. In the semiconductor package in which the semiconductor chips are stacked, the reliability of the stacked semiconductor chips is required.

SUMMARY

The inventive concept relates to a semiconductor package in which reliability between stacked semiconductor chips is improved.

The objective of the inventive concept is not limited to the above described ones, and other objectives that are not mentioned will be clearly understood by those skilled in the art from the following description.

A semiconductor package includes a first semiconductor chip including through silicon vias (TSVs), where respective upper conductive pads are electrically connected to the TSVs and are on an upper surface of the first semiconductor chip, a second semiconductor chip on the first semiconductor chip, with lower conductive pads are on a lower surface of the second semiconductor chip, conductive bumps between the upper conductive pads and the lower conductive pads, an interlayer adhesive layer between the first semiconductor chip and the second semiconductor chip, and an encapsulant on a side surface of the second semiconductor chip. An interlayer space is between the first semiconductor chip and the second semiconductor chip and overlaps the first semiconductor chip and the second semiconductor chip in a vertical direction that is perpendicular to the upper and lower surfaces of both the first semiconductor chip and the second semiconductor chip. The encapsulant extends into the interlayer space.

A semiconductor package includes a plurality of semiconductor chips including through silicon vias (TSVs), where the plurality of semiconductor chips are stacked on one another, conductive pads on upper surfaces of the plurality of semiconductor chips and lower surfaces of the plurality of semiconductor chips, conductive bumps electrically connected to the conductive pads, an interlayer adhesive layer between the plurality of semiconductor chips, and an encapsulant on side surfaces of the plurality of semiconductor chips. The interlayer adhesive layer is in a first portion of an interlayer space that is between adjacent semiconductor chips among the plurality of semiconductor chips. The interlayer space overlaps the adjacent semiconductor chips in a vertical direction that is perpendicular to a direction in which the plurality of semiconductor chips are stacked. The encapsulant extends into the interlayer space.

A semiconductor package includes a plurality of semiconductor chips including through silicon vias (TSVs), conductive pads on upper surfaces of the plurality of semiconductor chips and lower surfaces of the plurality of semiconductor chips, conductive bumps electrically connected to the conductive pads, an interlayer adhesive layer between the plurality of semiconductor chips, an encapsulant on side surfaces of the plurality of semiconductor chips, and an upper semiconductor chip on the plurality of semiconductor chips, electrically connected to the plurality of semiconductor chips, and having a thickness greater than a thickness of each of the semiconductor chips. An interlayer space is between two adjacent semiconductor chips among the plurality of semiconductor chips and overlaps the two adjacent semiconductor chips in a vertical direction that is perpendicular to the plurality of stacked semiconductor chips. The interlayer adhesive layer is in a first portion of the interlayer space, and the encapsulant extends into a corner of the interlayer space and is in a second portion of the interlayer space that is free of the interlayer adhesive layer.

BRIEF DESCRIPTION OF THE DRAWINGS

Embodiments will be more clearly understood from the following detailed description taken in conjunction with the accompanying drawings in which.

DETAILED DESCRIPTION

Figure 1:
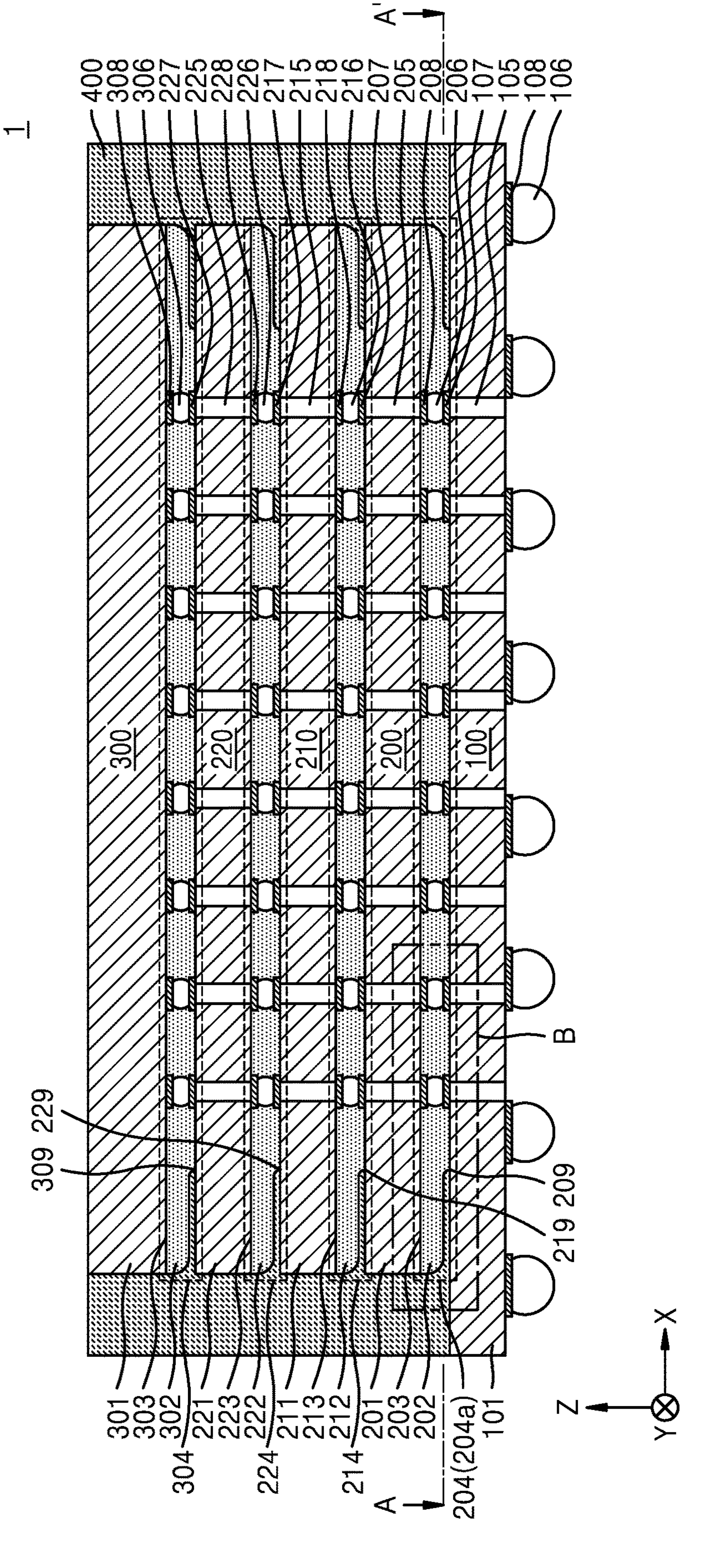
FIG. 1 is a side cross-sectional view for explaining a semiconductor package according to some embodiments.

Embodiments of the inventive concept are provided to fully explain the inventive concept to those of ordinary skill in the art, the following embodiments may be modified in many different forms, and the scope of the inventive concept is not limited to the following embodiments. Rather, these embodiments are provided so that the inventive concept will be thorough and complete, and will fully convey the concept of the inventive concept to those of skilled in the art.

After a front-end process where circuits are formed on a wafer, semiconductor chips undergo a back-end process consisting of a packaging process and a test. Although micro electric circuits are integrated on a semiconductor chip, it may be difficult to perform the role of a semiconductor by the semiconductor chip alone. A packaging process connects a chip electrically to the outside so that the chip may function properly and protect the chip from the external environment. In addition, packaging allows efficient dissipation of heat emitted by semiconductors.

A semiconductor package may perform roles including mechanical protection, electrical connection, mechanical connection, and thermal dissipation. In other words, semiconductor chips may be wrapped with a packaging material, such as an epoxy molding compound (EMC), to be protected from external mechanical and chemical impacts. The packaging may physically or electrically connect the semiconductor chips to a system to supply power to operate the semiconductor chips. In addition, the packaging ensures input and output of signals to allow the semiconductor chips to perform desired functions, and allows dissipation of heat generated during operation of semiconductor products.

Methods of packaging semiconductors may be classified into conventional packaging where a packaging process is applied to individual chips separated from a wafer, and wafer-level packaging (WLP) where part or all of the process is carried out at the wafer level and subsequently a wafer is cut into single pieces.

The early packaging technology is a lead frame method that connects chips to pads by using gold wires. However, with the improvement in the device performance, a lead frame structure has faced its limit, and accordingly, a fine-pitch ball grid array (FB GA) based on a micropatterned substrate is applied. The conventional packaging may stack a number of chips in a package and thus may be mainly applied to NAND or mobile dynamic random access memory (DRAM) putting emphasis on high capacity.

In order to meet requirements of memory products, the conventional packaging as an existing traditional method has been developed, and at the same time, the WLP as a new method is introduced. The WLP is technology suitable for realizing high-performance products and packaging in approximately the same size as the chip is possible. Therefore, the size of finished semiconductor products may be reduced or minimized, and the cost may be reduced because materials, such as substrates or wires, are not included. The WLP process may be utilized for products, such as high bandwidth memory (HBM) or computing DRAM, which requires high capacity and/or high density. HBM is a 3D-type memory semiconductor in which several DRAMs are vertically connected. A plurality of semiconductor chips may be cumulatively stacked in a semiconductor package including HBM. Since it is necessary to improve the reliability of the stacked semiconductor chips, a semiconductor package 1 according to the inventive concept is described in detail with reference to the following drawings.

FIG. 1 is a side cross-sectional view for explaining the semiconductor package 1 according to some embodiments.

Referring to FIG. 1, the semiconductor package 1 may include a plurality of semiconductor chips stacked in a vertical direction (a Z-axis direction). For example, the semiconductor package 1 may include a lower semiconductor chip 100, a first semiconductor chip 200, a second semiconductor chip 210, a third semiconductor chip 220, and an upper semiconductor chip 300, which are stacked in the vertical direction.

For example, a horizontal cross-sectional area of the lower semiconductor chip 100 may be greater than a horizontal cross-sectional area of each of the first to third semiconductor chips 200, 210, and 220 and/or the upper semiconductor chip 300. The horizontal cross-sectional areas of the first to third semiconductor chips 200, 210, and 220 and the upper semiconductor chip 300 may be substantially the same, according to some embodiments. As illustrated in FIG. 1, the first to third semiconductor chips 200, 210, and 220 and the upper semiconductor chip 300 may overlap the lower semiconductor chip 100 in the vertical direction.

In some embodiments, the lower semiconductor chip 100, the first to third semiconductor chips 200, 210, and 220, and the upper semiconductor chip 300 may be the same type of semiconductor chip. For example, the lower semiconductor chip 100, the first to third semiconductor chips 200, 210, and 220, and the upper semiconductor chip 300 may each be a memory semiconductor chip. The memory semiconductor chip may be, for example, a volatile memory semiconductor chip, such as DRAM or static random access memory (SRAM), or a non-volatile memory semiconductor chip, such as phase-change random access memory (PRAM), magnetoresistive random access memory (MRAM), ferroelectric random access memory (FeRAM), or resistive random access memory (RRAM).

In some embodiments, the lower semiconductor chip 100, the first to third semiconductor chips 200, 210, and 220, and the upper semiconductor chip 300 may include different types of semiconductor chips. For example, some semiconductor chips among the lower semiconductor chip 100, the first to third semiconductor chips 200, 210, and 220, and the upper semiconductor chip 300 may each be a logic chip, and other semiconductor chips among the lower semiconductor chip 100, the first to third semiconductor chips 200, 210, and 220, and the upper semiconductor chip 300 may each be a memory chip. For example, the logic chip include a central processing unit (CPU) chip, a graphics processing unit (GPU) chip, and/or an application processor (AP) chip.

In some embodiments, the lower semiconductor chip 100, the first to third semiconductor chips 200, 210, and 220, and the upper semiconductor chip 300 may be realized based on HBM or a hybrid memory cube (HMC) standard. In this case, the lower semiconductor chip 100 arranged lowermost may function as a buffer die, and the first to third semiconductor chips 200, 210, and 220 and the upper semiconductor chip 300 may function as a core die. For example, the buffer die may also be referred to as an interface die, a base die, a logic die, a master die, and the like, and the core die may also be referred to as a memory die, a slave die, or the like. Although FIG. 1 illustrates that four core dies are included in the semiconductor package 1, the number of core dies may vary. For example, the semiconductor package 1 may include four core dies, eight core dies, twelve core dies, or sixteen core dies.

The lower semiconductor chip 100 may include a lower semiconductor substrate 101, a semiconductor device layer (not shown), and through silicon vias (TSVs) 105.

The lower semiconductor substrate 101 may include, for example, silicon (Si). In some embodiments, the lower semiconductor substrate 101 may include a semiconductor element, such as germanium (Ge), or a compound semiconductor, such as silicon carbide (SiC), gallium arsenide (GaAs), indium arsenide (InAs), and/or indium phosphide (InP). The lower semiconductor substrate 101 may include a conductive region, for example, an impurity-doped well or an impurity-doped structure. In addition, the lower semiconductor substrate 101 may have various device isolation structures, such as a shallow trench isolation (STI) structure.

The semiconductor device layer (not shown) may be arranged on a lower surface of the lower semiconductor chip 100. The semiconductor device layer may include various types of individual devices and an interlayer insulating film (not shown). The individual devices may include various microelectronic devices, for example, a metal-oxide-semiconductor field effect transistor (MOSFET), such as a complementary metal-insulator-semiconductor (CMOS) transistor, an image sensor, such as system large scale integration (LSI), flash memory, DRAM, SRAM, electrically erasable programmable read-only memory (EEPROM), PRAM, MRAM, RRAM, or a CMOS imaging sensor (CIS), a micro-electro-mechanical system (MEMS), an active device, or a passive device. The individual devices may be electrically connected to the conductive region of the lower semiconductor substrate 101. The semiconductor device layer may further include a conductive wiring or conductive plug that electrically connects at least two of the individual devices to each other or the individual devices to the conductive region of the lower semiconductor substrate 101.

The TSVs 105 may at least partially penetrate the lower semiconductor substrate 101, and may further at least partially penetrate the semiconductor device layer (not shown). The TSVs 105 may be configured to electrically connect to each other upper conductive pads 107 disposed on an upper surface of the lower semiconductor chip 100 and lower conductive pads 108 disposed on a lower surface opposite to the upper surface of the lower semiconductor chip 100. The TSVs 105 may include a pillar-shaped buried conductive layer and a cylindrical conductive barrier film surrounding a sidewall of the buried conductive layer. The buried conductive layer may include at least one material of copper (Cu), tungsten (W), nickel (Ni), and/or cobalt (Co). The conductive barrier film may include at least one material of Ti, TiN, Ta, TaN, Ru, Co, Mn, WN, Ni, and/or NiB. A via insulating film may be arranged between the lower semiconductor substrate 101 and the TSVs 105. The via insulating film may include an oxide film, a nitride film, a carbide film, a polymer film, or a combination thereof.

The lower conductive pads 108 may be provided on the lower surface of the lower semiconductor chip 100. For example, the lower conductive pads 108 may be disposed on the semiconductor device layer (not shown), and may be electrically connected to the TSVs 105. The lower conductive pads 108 may include at least one of aluminum (Al), Cu, Ni, W, platinum (Pt), and/or gold (Au).

Conductive bumps 106 may be provided on the lower conductive pads 108. The conductive bumps 106 may be disposed on a lowermost surface of the semiconductor package 1, and may be bumps for mounting the semiconductor package 1 on an external substrate or an interposer. The conductive bumps 106 may receive, from the outside, at least one of a control signal, a power signal, or a ground signal, each for operation of the lower semiconductor chip 100, the first to third semiconductor chips 200, 210, and 220, and the upper semiconductor chip 300. The conductive bumps 106 may receive, from the outside, a data signal to be stored in the lower semiconductor chip 100, the first to third semiconductor chips 200, 210, and 220, and the upper semiconductor chip 300. The conductive bumps 106 may be utilized as an electrical path for providing, to the outside, data stored in the lower semiconductor chip 100, the first to third semiconductor chips 200, 210, and 220, and the upper semiconductor chip 300.

The upper conductive pads 107 may be provided on the upper surface of the lower semiconductor chip 100. The upper conductive pads 107 may include at least one of Al, Cu, Ni, W, Pt, and/or Au.

The first semiconductor chip 200 may be disposed on the upper surface of the lower semiconductor chip 100. The lower semiconductor chip 100 and the first semiconductor chip 200 may be electrically connected to each other via conductive bumps 206. An interlayer adhesive layer 202 surrounding the conductive bumps 206 may be arranged between the lower semiconductor chip 100 and the first semiconductor chip 200. The interlayer adhesive layer 202 may include, for example, a non-conductive film (NCF), a non-conductive paste (NCP), an insulating polymer, and/or an epoxy resin.

The first semiconductor chip 200 may include a first semiconductor substrate 201, a semiconductor device layer (not shown), TSVs 205, upper conductive pads 207, and lower conductive pads 208. The first semiconductor substrate 201, the semiconductor device layer (not shown), the TSVs 205, the upper conductive pads 207, and the lower conductive pads 208 included in the first semiconductor chip 200 may have characteristics substantially the same as or similar to those of the lower semiconductor substrate 101, the semiconductor device layer (not shown), the TSVs 105, the upper conductive pads 107, and the lower conductive pads 108 of the lower semiconductor chip 100, respectively, and thus, detailed descriptions of the first semiconductor chip 200 are omitted.

The second semiconductor chip 210 may be mounted on the first semiconductor chip 200, and may include a second semiconductor substrate 211, a semiconductor device layer (not shown), TSVs 215, upper conductive pads 217, and lower conductive pads 218. The first semiconductor chip 200 and the second semiconductor chip 210 may be electrically connected to each other via conductive bumps 216, and an interlayer adhesive layer 212 surrounding the conductive bumps 216 may be arranged between the first semiconductor chip 200 and the second semiconductor chip 210. The second semiconductor substrate 211, the semiconductor device layer (not shown), the TSVs 215, the upper conductive pads 217, and the lower conductive pads 218 of the second semiconductor chip 210 may have characteristics substantially similar to those of the lower semiconductor substrate 101, the semiconductor device layer (not shown), the TSVs 105, the upper conductive pads 107, and the lower conductive pads 108 of the lower semiconductor chip 100, and thus, detailed descriptions of the second semiconductor chip 210 are omitted.

The third semiconductor chip 220 may be mounted on the second semiconductor chip 210, and may include a third semiconductor substrate 221, a semiconductor device layer (not shown), TSVs 225, upper conductive pads 227, and lower conductive pads 228. The second semiconductor chip 210 and the third semiconductor chip 220 may be electrically connected to each other via conductive bumps 226, and an interlayer adhesive layer 222 surrounding the conductive bump 226 may be arranged between the second semiconductor chip 210 and the third semiconductor chip 220. The third semiconductor substrate 221, the semiconductor device layer (not shown), the TSVs 225, the upper conductive pads 227, and the lower conductive pads 228 of the third semiconductor chip 220 may have characteristics similar to those of the lower semiconductor substrate 101, the semiconductor device layer (not shown), the TSVs 105, the upper conductive pads 107, and the lower conductive pads 108 of the lower semiconductor chip 100, and thus, detailed descriptions of the third semiconductor chip 220 are omitted.

The upper semiconductor chip 300 may be mounted on the third semiconductor chip 220, and may include an upper semiconductor substrate 301, a semiconductor device layer (not shown), and lower conductive pads 308. The third semiconductor chip 220 and the upper semiconductor chip 300 may be electrically connected to each other via conductive bumps 306, and an interlayer adhesive layer 302 surrounding the conductive bumps 306 may be arranged between the third semiconductor chip 220 and the upper semiconductor chip 300. A thickness of the upper semiconductor chip 300 in the vertical direction (the Z-axis direction) may be greater than a thickness of each of the lower semiconductor chip 100 and the first to third semiconductor chips 200, 210, and 220 in the vertical direction. The upper semiconductor substrate 301, the semiconductor device layer (not shown), and the lower conductive pads 308 of the upper semiconductor chip 300 have characteristics similar to those of the first to third semiconductor chips 200, 210, and 220, the first to third semiconductor substrates 201, 211, and 221, the semiconductor device layers (not shown), the TSVs 205, 215, and 225, the upper conductive pads 207, 217, and 227, and the lower conductive pads 208, 218, and 228, except that the upper semiconductor chip 300 does not include TSVs and upper conductive pads, and thus, detailed descriptions of the upper semiconductor chip 300 are omitted.

The semiconductor package 1 may include an encapsulant 400 in contact with sidewalls of the first to third semiconductor chips 200, 210, and 220 and the upper semiconductor chip 300 and in contact with the upper surface of the lower semiconductor chip 100. The encapsulant 400 may cover or overlap a portion of the upper surface of the lower semiconductor chip 100 protruding from a sidewall of the first semiconductor chip 200 in a horizontal direction (an X-axis direction and/or a Y-axis direction), and may surround the sidewalls of the first to third semiconductor chips 200, 210, and 220 and the upper semiconductor chip 300. In some embodiments, a sidewall of the lower semiconductor chip 100 and a sidewall of the encapsulant 400 may be aligned with each other in the vertical direction (the Z-axis direction).

In some embodiments, the encapsulant 400 may include an insulating polymer or an epoxy resin. The encapsulant 400 may include an EMC.

The semiconductor package 1 of the inventive concept may include more semiconductor chips than the lower semiconductor chip 100, the first to third semiconductor chips 200, 210, and 220, and the upper semiconductor chip 300, which are semiconductor chips included in the semiconductor package 1. The number of semiconductor chips included in the semiconductor package 1 of the inventive concept is not limited by this specification.

Figure 2:
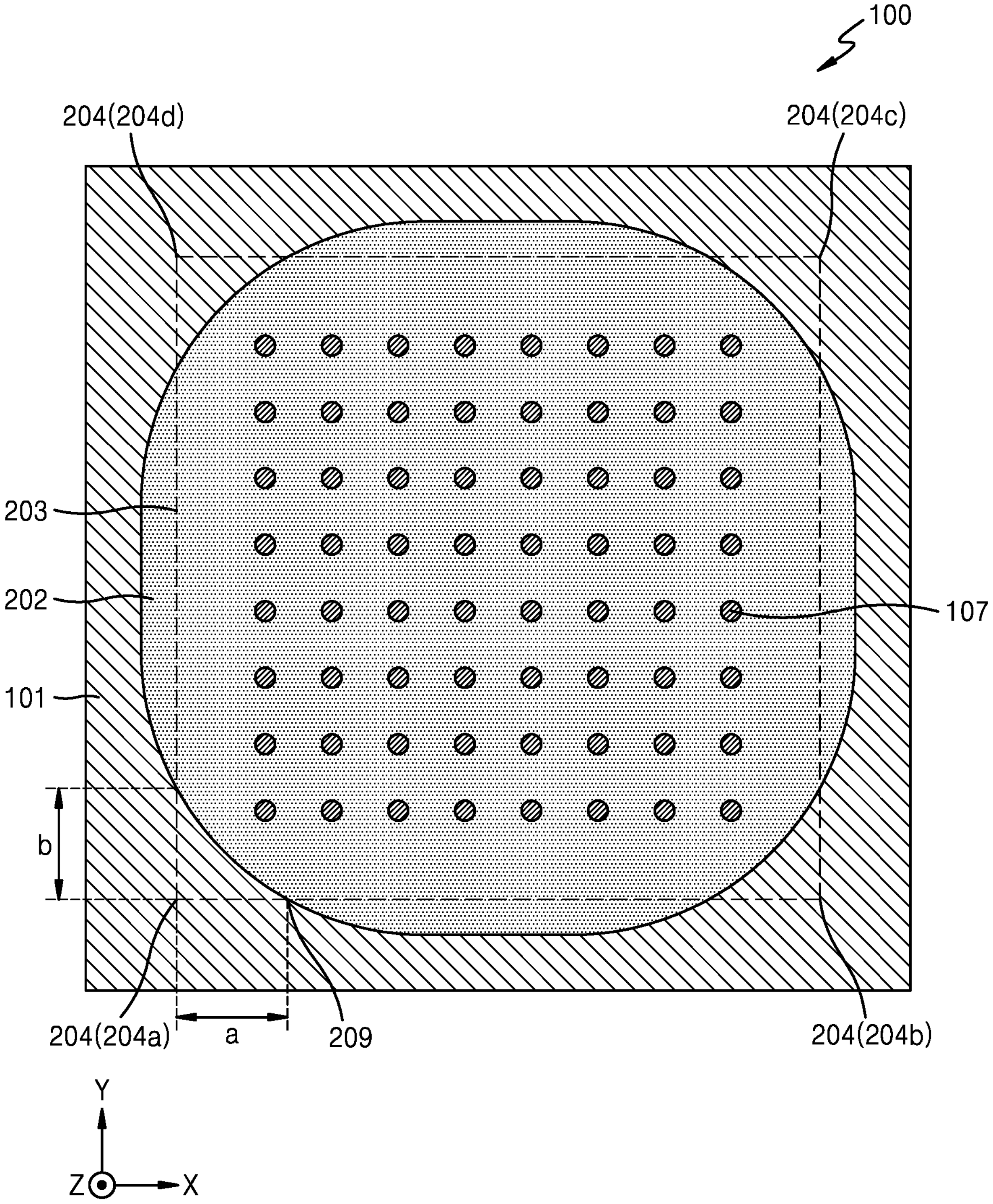
FIG. 2 is a cross-sectional view when AA' plane of FIG. 1 is viewed in a −Z-axis direction.

FIG. 2 is a cross-sectional view when AA' plane of FIG. 1 is viewed in a −Z-axis direction.

Figure 3:
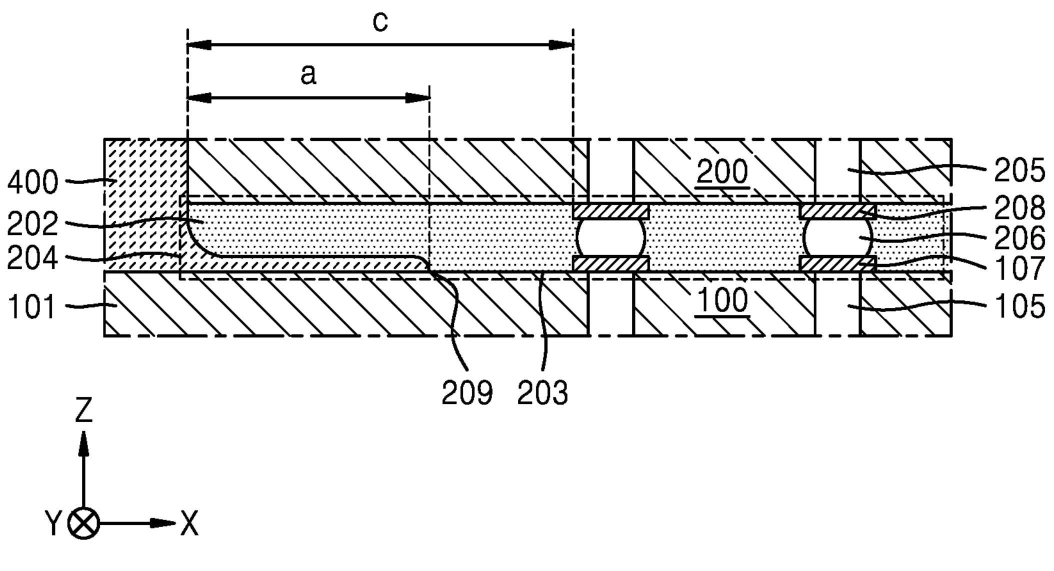
FIG. 3 is a side cross-sectional view showing enlarged B portion of FIG. 1 according to some embodiments.

FIG. 3 is a side cross-sectional view showing enlarged B portion of FIG. 1 according to some embodiments.

Referring to FIGS. 2 and 3, the interlayer adhesive layer 202 may be arranged between the lower semiconductor chip 100 and the first semiconductor chip 200 as described above. In an interlayer space 203 arranged between the lower semiconductor chip 100 and the first semiconductor chip 200 and overlapping the lower semiconductor chip 100 and the first semiconductor chip 200 in the vertical direction (the Z-axis direction), the interlayer adhesive layer 202 may fill a portion of the interlayer space 203, and the encapsulant 400 may extend into the interlayer space 203.

An X-Y plane shape of the interlayer space 203 may be the same as an X-Y plane shape of the first semiconductor chip 200. When the X-Y plane shape of the first semiconductor chip 200 is a quadrangle, the X-Y plane shape of the first semiconductor chip 200 has four vertices, and thus, the X-Y plane shape of the interlayer space 203 may also have four vertices. When viewed in an X-axis direction or a Y-axis direction, the four vertices may be observed as an edge of the interlayer space 203, the edge extending in the Z-axis direction. Herein, a portion including the vertices of the X-Y plane shape of the interlayer space 203 or the edge of the interlayer space 203 extending in the Z-axis direction described above is hereinafter referred to as a corner 204 of the interlayer space 203. In some embodiments, as shown in FIG. 2, when a shape of the first semiconductor chip 200 is a quadrangle, a shape of the interlayer space 203 may also be a quadrangle. FIG. 2 is a view of AA' cross-section in the −Z-axis direction, and the corner 204 is shown as four corners 204*a*, 204*b*, 204*c*, and 204*d* of the quadrangle in FIG. 2.

The interlayer adhesive layer 202 arranged in the interlayer space 203 may fill a portion of the periphery of the corner 204 of the interlayer space 203. Referring to FIG. 1, the interlayer adhesive layer 202 may be in contact with the entire lower surface of the first semiconductor chip 200. In contrast, the interlayer adhesive layer 202 may not be in contact with a portion of the lower surface of the lower semiconductor chip 100, in a portion where the corner 204 of the interlayer space 203 is arranged in the lower semiconductor chip 100. The interlayer adhesive layer 202 may surround the upper conductive pads 107, the conductive bumps 206, and the lower conductive pads 208. In some embodiments, the interlayer adhesive layer 202 may surround the upper conductive pads 107, the conductive bumps 206, and the lower conductive pads 208, which are arranged in the interlayer space 203 between the lower semiconductor chip 100 and the first semiconductor chip 200. In other words, the interlayer adhesive layer 202 may be formed so that the encapsulant 400 is not in contact with the upper conductive pads 107, the conductive bumps 206, and the lower conductive pads 208.

The encapsulant 400 may extend into the interlayer space 203. In some embodiments, a portion of the encapsulant 400 may be apart from the lower surface of the first semiconductor chip 200 and may extend into the interlayer space 203. In some embodiments, a portion of the encapsulant 400 may be apart from the lower surface of the first semiconductor chip 200, and the interlayer adhesive layer 202 may be arranged between the encapsulant 400 and the lower surface of the first semiconductor chip 200. In some embodiments, the encapsulant 400 may extend into the corner 204 of interlayer space 203. The encapsulant 400 may fill a space where the interlayer adhesive layer 202 in the interlayer space 203 is not arranged in a portion where the corner 204 is arranged. In other words, the encapsulant extends into a corner of the interlayer space and is in a portion of the interlayer space that is free of the interlayer adhesive layer. In some embodiments, the encapsulant 400 may be in contact with a boundary of the interlayer adhesive layer 202 in the interlayer space 203. The encapsulant 400 may extend into the interlayer space 203 while not being in contact with the upper conductive pads 107, the conductive bumps 206, and the lower conductive pads 208.

A distance c from the corner 204 to the upper conductive pad 107, the conductive bump 206, and the lower conductive pad 208 may be greater than a distance a from the corner 204*a* to the encapsulant 400 extending furthest into the interlayer space 203.

The distance a from the corner 204 to the encapsulant 400 extending furthest into the interlayer space 203 may be at least about 50 μm and not more than about 1,600 μm. In some embodiments, referring to FIG. 2, the distance a from the corner 204*a* to the encapsulant 400 extending furthest in the X-axis direction into the interlayer space 203 may be at least about 50 μm and not more than about 1,600 μm. In addition, the distance b from the corner 204*a* to the encapsulant 400 extending furthest in the Y-axis direction into the interlayer space 203 may be at least about 50 μm and not more than about 1,600 μm.

The numerical range described as not more than about 1,600 μm is a numeral range for the encapsulant 400 not to be in contact with the upper conductive pads 107, the conductive bumps 206, and the lower conductive pads 208.

Referring to FIGS. 1 to 3, the interlayer adhesive layer 212 may be arranged between the first semiconductor chip 200 and the second semiconductor chip 210. In an interlayer space 213 arranged between the first semiconductor chip 200 and the second semiconductor chip 210 and overlapping the first semiconductor chip 200 and the second semiconductor chip 210 in the vertical direction (the Z-axis direction), the interlayer adhesive layer 212 may fill a portion of the interlayer space 213, and the encapsulant 400 may extend into the interlayer space 213.

An X-Y plane shape of the interlayer space 213 may be the same as an X-Y plane shape of the first semiconductor chip 200 or the second semiconductor chip 210. When the X-Y plane shape of the first semiconductor chip 200 or the second semiconductor chip 210 is a quadrangle, the X-Y plane shape of the first semiconductor chip 200 or the second semiconductor chip 210 has four vertices, and thus, the X-Y plane shape of the interlayer space 213 may also have four vertices. When viewed in the X-axis direction or the Y-axis direction, the four vertices may be observed as an edge of the interlayer space 213, the edge extending in the Z-axis direction. Herein, a portion including the vertices of the X-Y plane shape of the interlayer space 213 or the edge of the interlayer space 213 extending in the Z-axis direction described above is hereinafter referred to as a corner 214 of the interlayer space 213. In some embodiments, when a shape of the first semiconductor chip 200 or the second semiconductor chip 210 is a quadrangle, a shape of the interlayer space 213 may also be a quadrangle.

The interlayer adhesive layer 212 arranged in the interlayer space 213 may fill a portion of the periphery of the corner 214 of the interlayer space 213. Referring to FIG. 1, the interlayer adhesive layer 212 may be in contact with the entire lower surface of the second semiconductor chip 210. In contrast, the interlayer adhesive layer 212 may not be in contact with a portion of the lower surface of the first semiconductor chip 200, in a portion where the corner 214 of the interlayer space 213 is arranged in the first semiconductor chip 200. The interlayer adhesive layer 212 may surround the upper conductive pads 207, the conductive bumps 216, and the lower conductive pads 218. In some embodiments, the interlayer adhesive layer 212 may surround the upper conductive pads 207, the conductive bumps 216, and the lower conductive pads 218, which are arranged in the interlayer space 213 between the first semiconductor chip 200 and the second semiconductor chip 210. In other words, the interlayer adhesive layer 212 may be formed so that the encapsulant 400 is not in contact with the upper conductive pads 207, the conductive bumps 216, and the lower conductive pads 218.

The encapsulant 400 may extend into the interlayer space 213. In some embodiments, a portion of the encapsulant 400 may be apart from the lower surface of the second semiconductor chip 210 and may extend into the interlayer space 213. In some embodiments, a portion of the encapsulant 400 may be apart from the lower surface of the second semiconductor chip 210, and the interlayer adhesive layer 212 may be arranged between the encapsulant 400 and the lower surface of the second semiconductor chip 210. In some embodiments, the encapsulant 400 may extend into the corner 214 of the interlayer space 213. The encapsulant 400 may fill or partially fill a space where the interlayer adhesive layer 212 in the interlayer space 213 is not arranged in a portion where the corner 214 is arranged. In some embodiments, the encapsulant 400 may be in contact with a boundary of the interlayer adhesive layer 212 in the interlayer space 213. The encapsulant 400 may extend into the interlayer space 213 while not being in contact with the upper conductive pads 207, the conductive bumps 216, and the lower conductive pads 218.

A distance 219 from the corner 214 to the encapsulant 400 extending furthest into the interlayer space 213 may be at least about 50 μm and not more than about 1,600 μm. Detailed descriptions of numerical values are the same as described above, and thus, redundant descriptions thereof are omitted.

The interlayer adhesive layer 222 may be arranged between the second semiconductor chip 210 and the third semiconductor chip 220. In an interlayer space 223 arranged between the second semiconductor chip 210 and the third semiconductor chip 220 and overlapping the second semiconductor chip 210 and the third semiconductor chip 220 in the vertical direction (the Z-axis direction), the interlayer adhesive layer 222 may fill or partially fill a portion of the interlayer space 223, and the encapsulant 400 may extend into the interlayer space 223.

An X-Y plane shape of the interlayer space 223 may be the same as an X-Y plane shape of the second semiconductor chip 210 or the third semiconductor chip 220. When the X-Y plane shape of the second semiconductor chip 210 or the third semiconductor chip 220 is a quadrangle, the X-Y plane shape of the second semiconductor chip 210 or the third semiconductor chip 220 has four vertices, and thus, the X-Y plane shape of the interlayer space 223 may also have four vertices. When viewed in the X-axis direction or the Y-axis direction, the four vertices may be observed as an edge of the interlayer space 223, the edge extending in the Z-axis direction. Herein, a portion including the vertices of the X-Y plane shape of the interlayer space 223 or the edge of the interlayer space 223 extending in the Z-axis direction described above is hereinafter referred to as a corner 224 of the interlayer space 223. In some embodiments, when a shape of the second semiconductor chip 210 or the third semiconductor chip 220 is a quadrangle, a shape of the interlayer space 223 may also be a quadrangle.

The interlayer adhesive layer 222 arranged in the interlayer space 223 may fill or partially fill a portion of the periphery of the corner 224 of the interlayer space 223. Referring to FIG. 1, the interlayer adhesive layer 222 may be in contact with the entire lower surface of the third semiconductor chip 220. In contrast, the interlayer adhesive layer 222 may not be in contact with a portion of the lower surface of the second semiconductor chip 210, in a portion where the corner 224 of the interlayer space 223 is arranged in the second semiconductor chip 210. The interlayer adhesive layer 222 may surround the upper conductive pads 217, the conductive bumps 226, and the lower conductive pads 228. In some embodiments, the interlayer adhesive layer 222 may surround the upper conductive pads 217, the conductive bumps 226, and the lower conductive pads 228, which are arranged in the interlayer space 223 between the second semiconductor chip 210 and the third semiconductor chip 220. In other words, the interlayer adhesive layer 222 may be formed so that the encapsulant 400 is not in contact with the upper conductive pads 217, the conductive bumps 226, and the lower conductive pads 228.

The encapsulant 400 may extend into the interlayer space 223. In some embodiments, a portion of the encapsulant 400 may be apart from the lower surface of the third semiconductor chip 220 and may extend into the interlayer space 223. In some embodiments, a portion of the encapsulant 400 may be apart from the lower surface of the third semiconductor chip 220, and the interlayer adhesive layer 222 may be arranged between the encapsulant 400 and the lower surface of the third semiconductor chip 220. In some embodiments, the encapsulant 400 may extend into the corner 224 of the interlayer space 223. The encapsulant 400 may fill or partially fill a space where the interlayer adhesive layer 222 in the interlayer space 223 is not arranged in a portion where the corner 224 is arranged. In some embodiments, the encapsulant 400 may be in contact with a boundary of the interlayer adhesive layer 222 in the interlayer space 223. The encapsulant 400 may extend into the interlayer space 223 while not being in contact with the upper conductive pads 217, the conductive bumps 226, and the lower conductive pads 228.

A distance 229 from the corner 224 to the encapsulant 400 extending furthest into the interlayer space 223 may be at least about 50 μm and not more than about 1,600 μm. Detailed descriptions of numerical values are the same as described above, and thus, redundant descriptions thereof are omitted.

The interlayer adhesive layer 302 may be arranged between the third semiconductor chip 220 and the upper semiconductor chip 300. In an interlayer space 303 arranged between the third semiconductor chip 220 and the upper semiconductor chip 300 and overlapping the third semiconductor chip 220 and the upper semiconductor chip 300 in the vertical direction (the Z-axis direction), the interlayer adhesive layer 302 may fill or partially fill a portion of the interlayer space 303, and the encapsulant 400 may extend into the interlayer space 303.

An X-Y plane shape of the interlayer space 303 may be the same as an X-Y plane shape of the third semiconductor chip 220 or the upper semiconductor chip 300. When the X-Y plane shape of the third semiconductor chip 220 or the upper semiconductor chip 300 is a quadrangle, the X-Y plane shape of the third semiconductor chip 220 or the upper semiconductor chip 300 has four vertices, and thus, the X-Y plane shape of the interlayer space 303 may also have four vertices. When viewed in the X-axis direction or the Y-axis direction, the four vertices may be observed as an edge of the interlayer space 303, the edge extending in the Z-axis direction. Herein, a portion including the vertices of the X-Y plane shape of the interlayer space 303 or the edge of the interlayer space 303 extending in the Z-axis direction described above is hereinafter referred to as a corner 304 of the interlayer space 303. In some embodiments, when a shape of the third semiconductor chip 220 or the upper semiconductor chip 300 is a quadrangle, a shape of the interlayer space 303 may also be a quadrangle.

The interlayer adhesive layer 302 arranged in the interlayer space 303 may fill or partially fill a portion of the periphery of the corner 304 of the interlayer space 303. Referring to FIG. 1, the interlayer adhesive layer 302 may be in contact with the entire lower surface of the upper semiconductor chip 300. In contrast, the interlayer adhesive layer 302 may not be in contact with a portion of the lower surface of the third semiconductor chip 220, in a portion where the corner 304 of the interlayer space 303 is arranged in the third semiconductor chip 220. The interlayer adhesive layer 302 may surround the upper conductive pads 227, the conductive bumps 306, and the lower conductive pads 308. In some embodiments, the interlayer adhesive layer 302 may surround the upper conductive pads 227, the conductive bumps 306, and the lower conductive pads 308, which are arranged in the interlayer space 303 between the third semiconductor chip 220 and the upper semiconductor chip 300. In other words, the interlayer adhesive layer 302 may be formed so that the encapsulant 400 is not in contact with the upper conductive pads 227, the conductive bumps 306, and the lower conductive pads 308.

The encapsulant 400 may extend from the outside of the interlayer space 303 into the interlayer space 303. In some embodiments, a portion of the encapsulant 400 may be apart from the lower surface of the upper semiconductor chip 300 and may extend into the interlayer space 303. In some embodiments, a portion of the encapsulant 400 may be apart from the lower surface of the upper semiconductor chip 300, and the interlayer adhesive layer 302 may be arranged between the encapsulant 400 and the lower surface of the upper semiconductor chip 300. In some embodiments, the encapsulant 400 may fill or partially fill a space where the interlayer adhesive layer 302 in the interlayer space 303 is not arranged in a portion where the corner 304 is arranged. In some embodiments, the encapsulant 400 may be in contact with a side surface of the interlayer adhesive layer 302, which is not in contact with the third semiconductor chip 220 and the upper semiconductor chip 300. The encapsulant 400 may extend into the interlayer space 303 while not being contact with the upper conductive pads 227, the conductive bumps 306, and the lower conductive pads 308.

A distance 309 from the corner 304 to the encapsulant 400 extending furthest into the interlayer space 303 may be at least about 50 μm and not more than about 1,600 μm. Detailed descriptions of numerical values are the same as described above, and thus, redundant descriptions thereof are omitted.

Adhesion of the encapsulant 400 to the lower semiconductor chip 100, the first to third semiconductor chips 200, 210, and 220, and the upper semiconductor chip 300 may be greater than adhesion of the interlayer adhesive layers 202, 212, 222, and 302 to the lower semiconductor chip 100, the first to third semiconductor chips 200, 210, and 220, and the upper semiconductor chip 300. The encapsulant 400 extends into the interlayer spaces 203, 213, 223, and 303 and fills or partially fills portions of interlayer spaces 203, 213, 223, and 303, and due to the adhesion of the encapsulant 400 to the lower semiconductor chip 100, the first to third semiconductor chips 200, 210, and 220, and the upper semiconductor chip 300, the reliability of the semiconductor package 1 in which the lower semiconductor chip 100, the first to third semiconductor chips 200, 210, and 220, and the upper semiconductor chip 300 are stacked may be improved.

Figure 4:
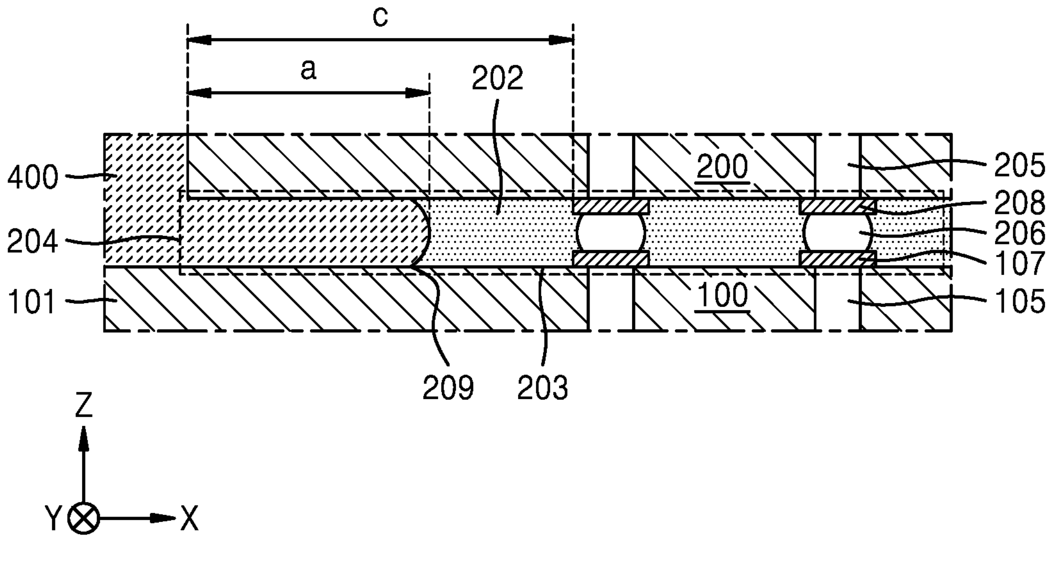
FIG. 4 is a side cross-sectional view showing enlarged B portion of FIG. 1 according to some embodiments.
Figure 5:
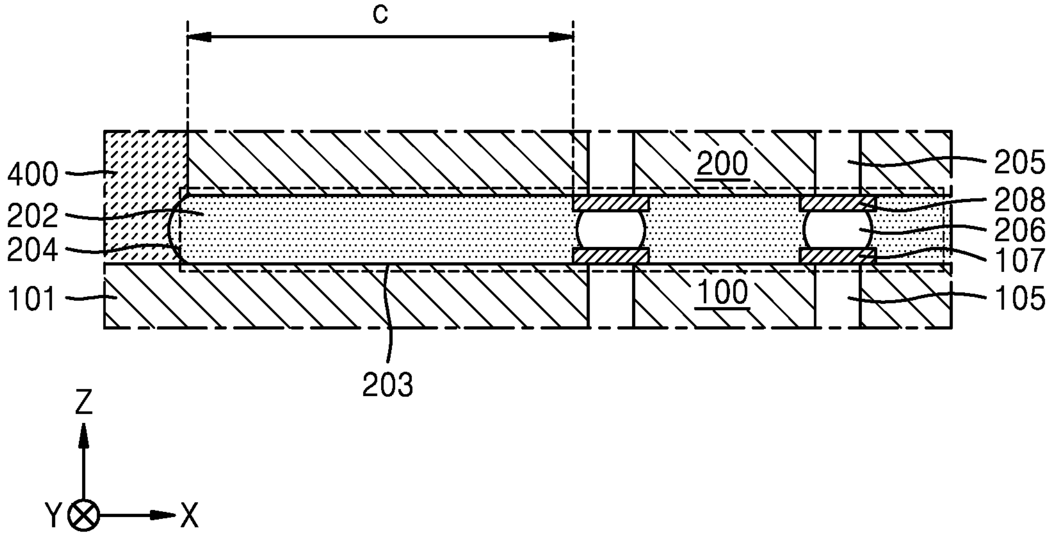
FIG. 5 is a side cross-sectional view showing an enlarged portion of a semiconductor package according to some embodiments.

FIG. 4 is a side cross-sectional view showing enlarged B portion of FIG. 1 according to some embodiments. FIG. 5 is a side cross-sectional view showing an enlarged portion of a semiconductor package according to some embodiments.

Referring to FIG. 4, the interlayer adhesive layer 202 may not be in contact with a portion of a corner portion of the lower surface of the first semiconductor chip 200. The encapsulant 400 may be in contact with each of a portion of the lower surface of the first semiconductor chip 200 and a portion of the upper surface of the lower semiconductor chip 100.

In the case of FIG. 4, like a case of FIG. 3, the distance c from the corner 204 to the upper conductive pad 107, the conductive bump 206, and the lower conductive pad 208 may be greater than the distance a from the corner 204 to the encapsulant 400 extending furthest into the interlayer space 203. A distance 209 from the corner 204 to the encapsulant 400 extending furthest into the interlayer space 203 may be at least about 50 μm and not more than about 1,600 μm.

Referring to FIG. 5, a shape of the interlayer adhesive layer 202 at a portion other than the corner 204 may extend laterally from the interlayer space 203. Referring to FIG. 2, the interlayer adhesive layer 202 may extend outward based on a perimeter of the interlayer space 203 formed along the corners 204*a*, 204*b*, 204*c*, and 204*d* of the interlayer space 203. The extended interlayer adhesive layer 202 may be in contact with the encapsulant 400 surrounding the lower semiconductor chip 100 and the first semiconductor chip 200.

Descriptions of the interlayer adhesive layer 202 may be applied to other interlayer adhesive layers 212, 222, 232, and 302, and descriptions of the encapsulant 400 may be applied to all interlayer spaces 203, 213, 223, 303. Redundant descriptions thereof are omitted.

FIGS. 6A to 6F are cross-sectional views showing a method of manufacturing the semiconductor package 1, according to some embodiments. Hereinafter, referring to FIGS. 6A to 6F, a method of manufacturing the semiconductor package 1 according to some embodiments is described.

Figure 6A:
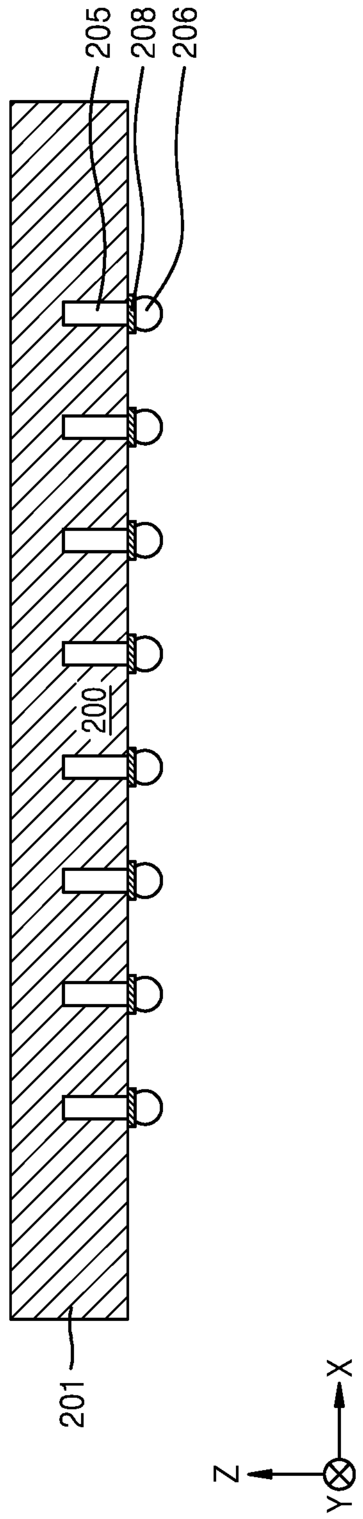
FIGS. 6A to 6F are cross-sectional views showing a method of manufacturing a semiconductor package, according to some embodiments.

Referring to FIG. 6A, the TSVs 205 may be formed by etching the lower surface of the first semiconductor substrate 201 having an upper surface and a lower surface in the Z-axis direction. In some embodiments, the forming of the TSVs 205 by etching the portion of the lower surface of the first semiconductor substrate 201 may include etching the portion of the lower surface of the first semiconductor substrate 201 by using a dry etching process. The first semiconductor substrate 201 may include a first semiconductor device layer (not shown). The lower conductive pads 208 may be formed on the lower surface of the first semiconductor substrate 201 and be electrically connected to the TSVs 205, and the conductive bumps 206 may be formed on the lower conductive pads 208.

Figure 6B:
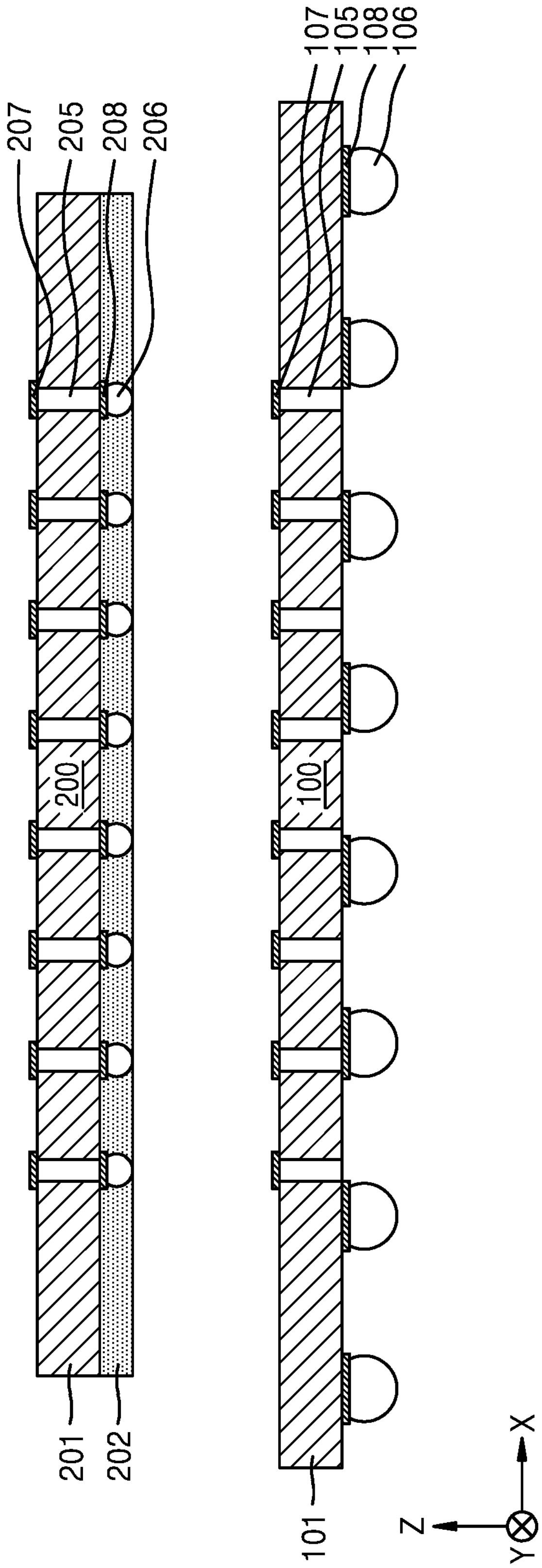

Referring to FIG. 6B, a portion of the TSVs 205 may be exposed by removing a portion of the first semiconductor substrate 201 of the first semiconductor chip 200. As a result of removing a portion of the upper surface of the first semiconductor substrate 201, the TSVs 205 may penetrate the first semiconductor substrate 201. In order to expose the TSVs 205, a portion of the upper surface of the first semiconductor substrate 201 may be removed by using a chemical mechanical polishing (CMP) process, an etch-back process, or a combination thereof. The upper conductive pads 207 electrically connected to the exposed TSVs 205 may be formed on the upper surface of the first semiconductor substrate 201.

The interlayer adhesive layer 202 for stacking on the lower semiconductor chip 100 previously prepared may be formed on the lower surface of the first semiconductor substrate 201. The interlayer adhesive layer 202 may include, for example, an NCF, an NCP, an insulating polymer, or an epoxy resin.

The first semiconductor chip 200 may be disposed on the lower semiconductor chip 100, which is previously prepared, including the TSVs 105 formed to penetrate at least a portion of the lower semiconductor substrate 101, the upper conductive pads 107, the lower conductive pads 108, and the conductive bumps 106.

Figure 6C:
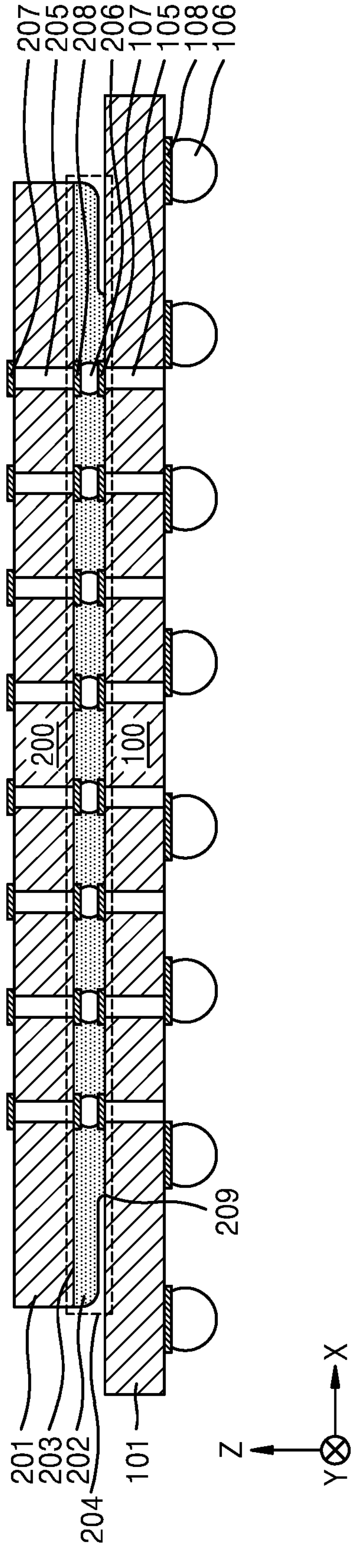

Referring to FIG. 6C, the first semiconductor chip 200 may be stacked on the lower semiconductor chip 100 while the upper conductive pads 107 and the conductive bumps 206 are electrically connected to each other. The stacking of the first semiconductor chip 200 includes thermocompression bonding.

In the stacking process, the interlayer adhesive layer 202 may fill or partially fill a portion of the interlayer space 203 as described above with reference to FIGS. 1 to 3. The interlayer adhesive layer 202 may fill or partially fill a portion of the periphery of the corner 204 of the interlayer space 203. The interlayer adhesive layer 202 may be in contact with the lower surface of the first semiconductor chip 200. In contrast, the interlayer adhesive layer 202 may not be in contact with a portion of the upper surface of the lower semiconductor chip 100, in a portion where the corner 204 of the interlayer space 203 is arranged in the lower semiconductor chip 100.

Figure 6D:
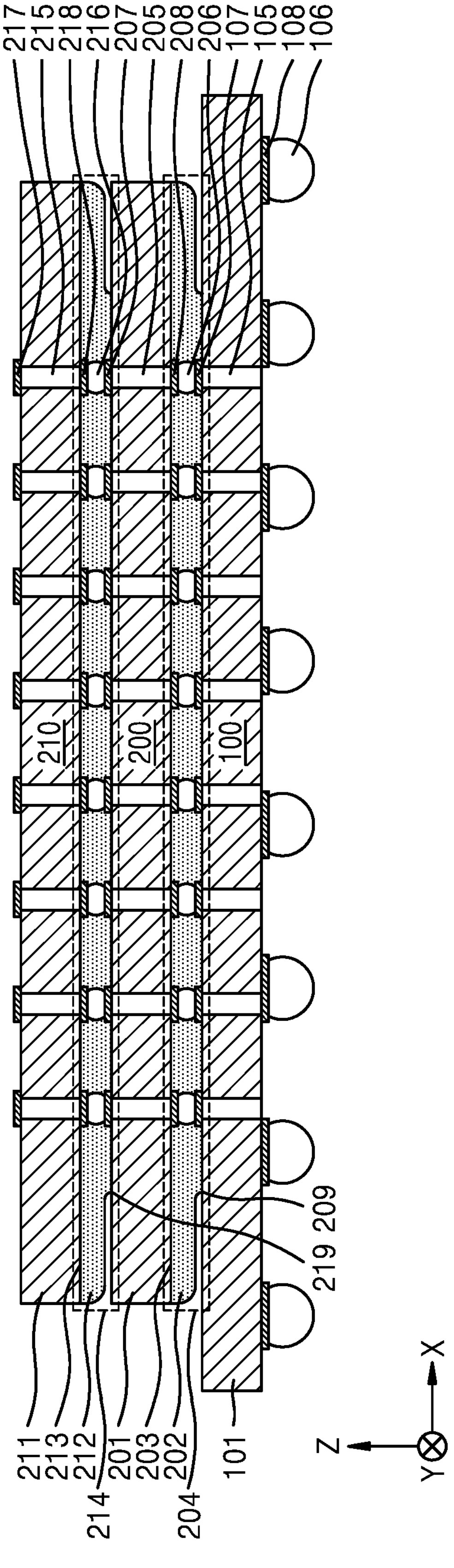

Referring to FIG. 6D, the second semiconductor chip 210 may be formed via the same process that forms the first semiconductor chip 200. The second semiconductor chip 210 may be stacked on the first semiconductor chip 200 as described above with reference to FIG. 6C. Redundant descriptions thereof are omitted.

Figure 6E:
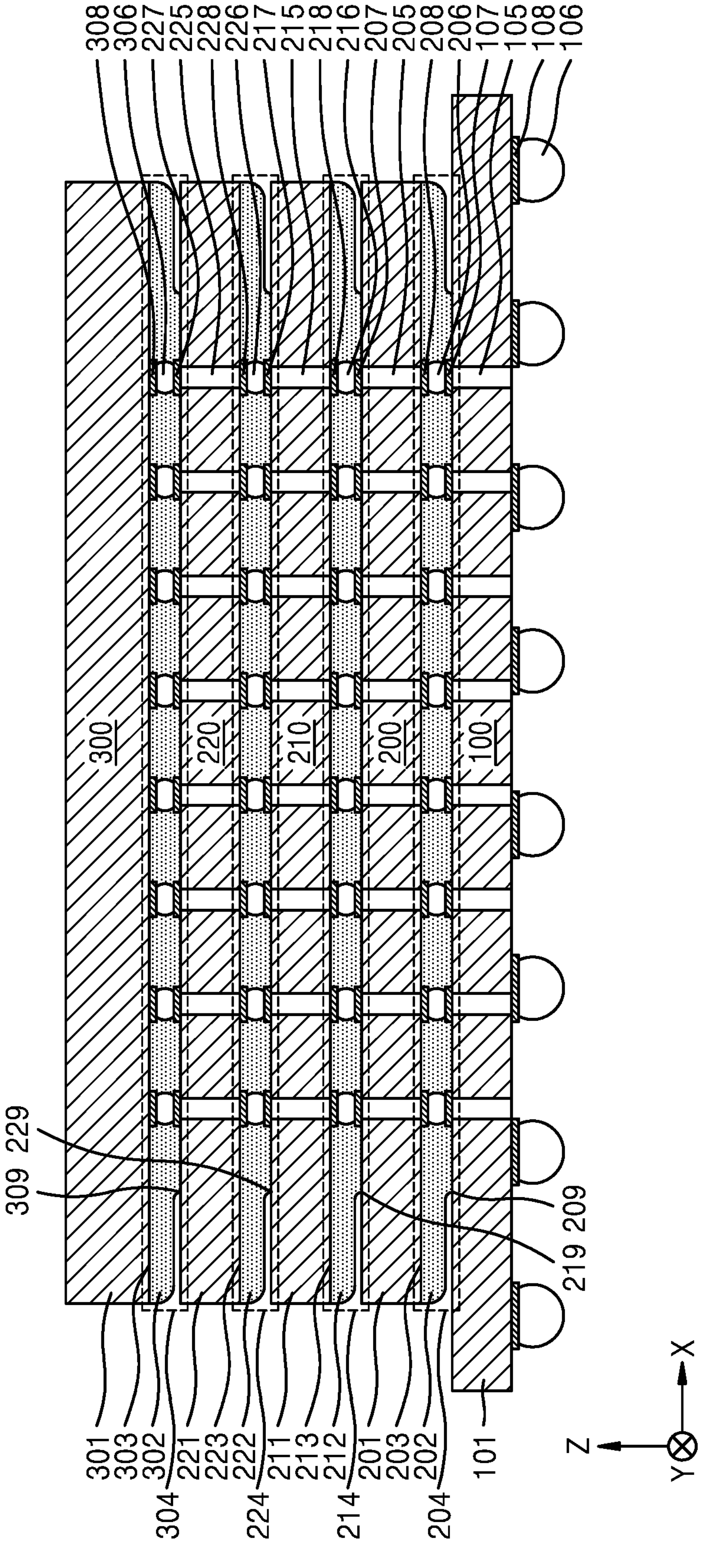

Referring to FIG. 6E, the third semiconductor chip 220 may be formed via the same process that forms the first semiconductor chip 200, and the third semiconductor chip 220 may be stacked on the second semiconductor chip 210. Redundant descriptions thereof are omitted.

The upper semiconductor chip 300 may have characteristics similar to those of the lower semiconductor chip 100 and the first to third semiconductor chips 200, 210, and 220, except that the upper semiconductor chip 300 does not include TSVs. The upper semiconductor chip 300 may be stacked on the third semiconductor chip 220 while the upper conductive pads 227 and the conductive bumps 306 are electrically connected to each other. Redundant descriptions of the upper semiconductor chip 300 are omitted.

Figure 6F:
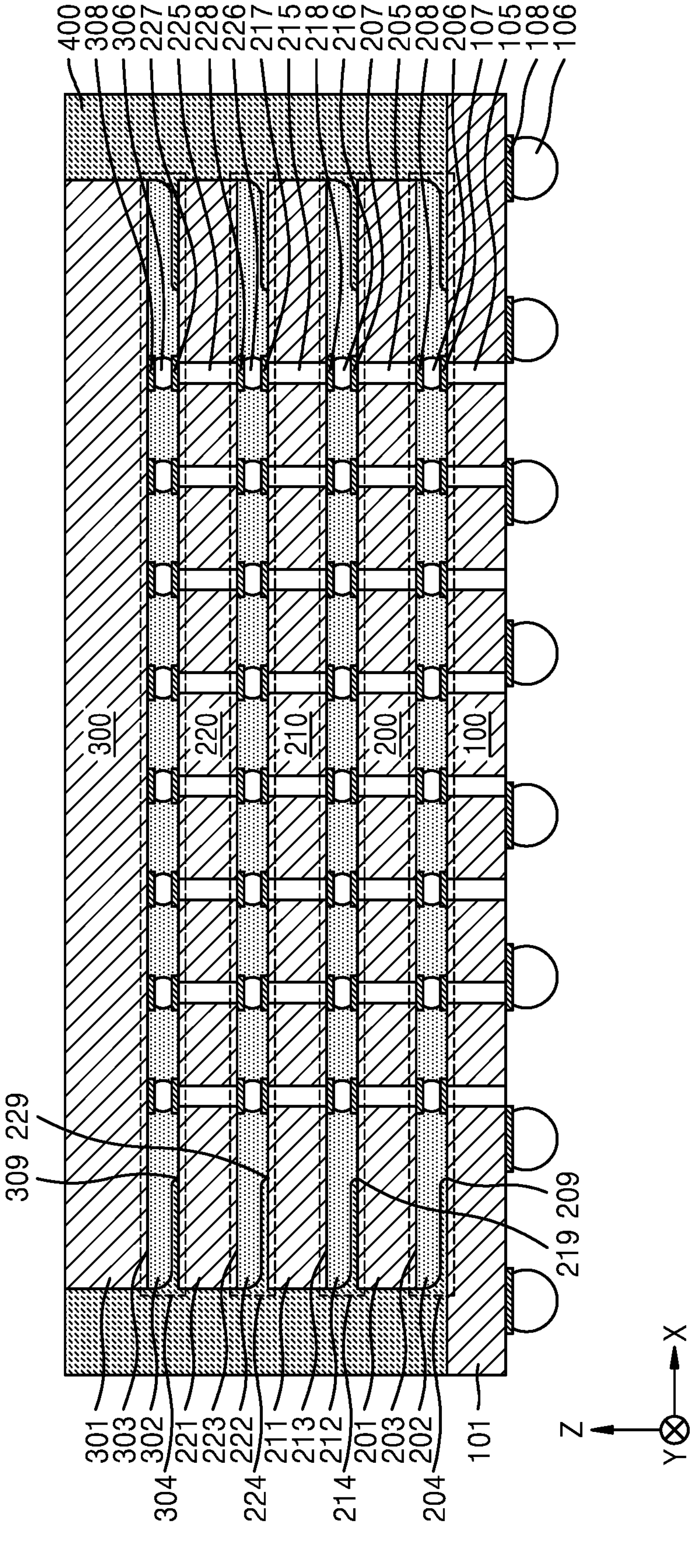

Referring to FIG. 6F, the encapsulant 400 may be formed to be in contact with sidewalls of the first to third semiconductor chips 200, 210, and 220 and the upper semiconductor chip 300 and in contact with the upper surface of the lower semiconductor chip 100. The encapsulant 400 may extend into the interlayer space 203 between the lower semiconductor chip 100 and the first semiconductor chip 200, the interlayer space 213 between the first semiconductor chip 200 and the second semiconductor chip 210, the interlayer space 223 between the second semiconductor chip 210 and the third semiconductor chip 220, and the interlayer space 303 between the third semiconductor chip 220 and the upper semiconductor chip 300. In addition, the encapsulant 400 may extend into each of the interlayer spaces 203, 213, 223, 303 to occupy a space not occupied by the interlayer adhesive layers 202, 212, 222, and 302 in the interlayer spaces 203, 213, 223, 303. Redundant descriptions of the encapsulant 400 and the interlayer adhesive layers 202, 212, 222, 302 are omitted.

While the inventive concept has been particularly shown and described with reference to embodiments thereof, it will be understood that various changes in form and details may be made therein without departing from the spirit and scope of the following claims.

What is claimed is:

1. A semiconductor package comprising:

a first semiconductor chip comprising through silicon vias (TSVs), wherein respective upper conductive pads are electrically connected to the TSVs and are on an upper surface of the first semiconductor chip;

a second semiconductor chip on the first semiconductor chip, wherein lower conductive pads are on a lower surface of the second semiconductor chip;

conductive bumps between the upper conductive pads and the lower conductive pads;

an interlayer adhesive layer between the first semiconductor chip and the second semiconductor chip; and an encapsulant on a side surface of the second semiconductor chip, wherein an interlayer space is between the first semiconductor chip and the second semiconductor chip and overlaps the first semiconductor chip and the second semiconductor chip in a vertical direction that is perpendicular to the upper and lower surfaces of both the first semiconductor chip and the second semiconductor chip, wherein the encapsulant comprises an L-shape having a vertical portion extending in the vertical direction and a horizontal portion that extends from the vertical portion into the interlayer space, and wherein the interlayer adhesive layer has an L-shaped surface that conforms to the L-shape of the encapsulant.

2. The semiconductor package of claim 1, wherein the encapsulant extends into a corner of the interlayer space that is adjacent the first semiconductor chip and aligns with the side surface of the second semiconductor chip in the vertical direction.

3. The semiconductor package of claim 2, wherein the interlayer adhesive layer has a portion that extends from the interlayer space beyond the side surface of the second semiconductor chip in a horizontal direction that is perpendicular to the vertical direction.

4. The semiconductor package of claim 1, wherein the side surface of the second semiconductor chip comprises a first side surface of the second semiconductor chip, wherein the encapsulant is on the first side surface of the second semiconductor chip and on a second side surface of the second semiconductor chip, and wherein the encapsulant extends into a portion of the interlayer space between the first semiconductor chip and the second semiconductor chip that is adjacent the first side surface of the second semiconductor chip, but does not extend to the second side surface of the second semiconductor chip.

5. The semiconductor package of claim 1, wherein the encapsulant is spaced apart from the lower surface of the second semiconductor chip.

6. The semiconductor package of claim 5, wherein the interlayer adhesive layer is between the encapsulant and the lower surface of the second semiconductor chip.

7. The semiconductor package of claim 1, wherein the encapsulant is not in contact with the upper conductive pads, the lower conductive pads, and the conductive bumps.

8. The semiconductor package of claim 1, wherein the interlayer adhesive layer is on respective side surfaces of the upper conductive pads, the lower conductive pads, and the conductive bumps, and wherein the upper conductive pads, the lower conductive pads, and the conductive bumps are between the first semiconductor chip and the second semiconductor chip.

9. The semiconductor package of claim 3, wherein the interlayer adhesive layer contacts an entirety of the lower surface of the second semiconductor chip, and a portion of the upper surface of the first semiconductor chip where the interlayer space overlaps.

10. The semiconductor package of claim 1, wherein the encapsulant is in contact with a portion of the upper surface of the first semiconductor chip.

11. The semiconductor package of claim 1, wherein the interlayer adhesive layer comprises a non-conductive film.

12. The semiconductor package of claim 1, wherein the encapsulant comprises epoxy molding compound (EMC).

13. The semiconductor package of claim 1, further comprising:

an upper semiconductor chip on the second semiconductor chip and having a thickness greater than a thickness of the first semiconductor chip or a thickness of the second semiconductor chip.

14. A semiconductor package comprising:

a plurality of semiconductor chips comprising through silicon vias (TSVs), wherein the plurality of semiconductor chips are stacked on one another;

conductive pads on upper surfaces of the plurality of semiconductor chips and lower surfaces of the plurality of semiconductor chips;

conductive bumps electrically connected to the conductive pads;

an interlayer adhesive layer between the plurality of semiconductor chips; and an encapsulant on side surfaces of the plurality of semiconductor chips, wherein the interlayer adhesive layer is in a first portion of an interlayer space that is between adjacent semiconductor chips among the plurality of semiconductor chips, wherein the interlayer space overlaps the adjacent semiconductor chips in a vertical direction that is perpendicular to a direction in which the plurality of semiconductor chips are stacked, wherein the encapsulant comprises an L-shape having a vertical portion extending in the vertical direction and a horizontal portion that extends from the vertical portion into the interlayer space, and wherein the interlayer adhesive layer has an L-shaped surface that conforms to the L-shape of the encapsulant.

15. The semiconductor package of claim 14, wherein the encapsulant is on first side surfaces and second side surfaces of the side surfaces of the adjacent semiconductor chips, and wherein the encapsulant extends into a second portion of the interlayer space between the adjacent semiconductor chips that is adjacent the first side surfaces of the adjacent semiconductor chips, but does not extend to the second side surfaces of the adjacent semiconductor chips.

16. The semiconductor package of claim 14, wherein the encapsulant is spaced apart from the TSVs, the conductive pads, and the conductive bumps.

17. The semiconductor package of claim 14, wherein the plurality of semiconductor chips are stacked by thermocompression bonding.

18. A semiconductor package comprising:

a plurality of semiconductor chips comprising through silicon via (TSVs);

conductive pads on upper surfaces of the plurality of semiconductor chips and lower surfaces of the plurality of semiconductor chips;

conductive bumps electrically connected to the conductive pads;

an interlayer adhesive layer between the plurality of semiconductor chips;

an encapsulant on side surfaces of the plurality of semiconductor chips; and an upper semiconductor chip on the plurality of semiconductor chips, electrically connected to the plurality of semiconductor chips, and having a thickness greater than a thickness of each of the plurality of semiconductor chips, wherein an interlayer space is between two adjacent semiconductor chips among the plurality of semiconductor chips and overlaps the two adjacent semiconductor chips in a vertical direction that is perpendicular to a direction in which the plurality of semiconductor chips are stacked, wherein the interlayer adhesive layer is in a first portion of the interlayer space, wherein the encapsulant comprises an L-shape having a vertical portion extending in the vertical direction and a horizontal portion that extends from the vertical portion into a corner of the interlayer space, and the L-shape is in a second portion of the interlayer space that is free of the interlayer adhesive layer, and wherein the interlayer adhesive layer has an L-shaped surface that conforms to the L-shape of the encapsulant.

19. The semiconductor package of claim 18, wherein a distance from the corner of the interlayer space to a portion of the encapsulant that furthest extends into the interlayer space is between 50 μm to 1,600 μm, and wherein the interlayer adhesive layer has a portion thereof that extends from a perimeter of the interlayer space to outside of the interlayer space.

* * * * *